(12) United States Patent
Chang et al.

(10) Patent No.: US 8,988,258 B2
(45) Date of Patent: Mar. 24, 2015

(54) HARDWARE COMPRESSION USING COMMON PORTIONS OF DATA

(75) Inventors: Jichuan Chang, Sunnyvale, CA (US); Krishnamurthy Viswanathan, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 783 days.

(21) Appl. No.: 13/285,492

(22) Filed: Oct. 31, 2011

(65) Prior Publication Data

US 2013/0111164 A1    May 2, 2013

(51) Int. Cl.
 *H03M 7/12* (2006.01)
 *H03M 7/30* (2006.01)

(52) U.S. Cl.
 CPC .................................. *H03M 7/3091* (2013.01)
 USPC ................................. 341/87; 341/50; 341/51

(58) Field of Classification Search
 CPC ..................................................... H03M 7/3091
 USPC .................. 341/50, 51, 87; 382/238, 232, 243
 See application file for complete search history.

(56) References Cited

U.S. PATENT DOCUMENTS

| 6,349,150 B1 * | 2/2002 | Jones ........................... 382/238 |
| 6,731,814 B2 | 5/2004 | Zeck et al. |
| 7,653,643 B2 | 1/2010 | Livshits |
| 2009/0055422 A1 | 2/2009 | Williams et al. |
| 2010/0082545 A1 | 4/2010 | Bhattacharjee et al. |

FOREIGN PATENT DOCUMENTS

WO    WO2010028967    3/2010

* cited by examiner

*Primary Examiner* — Jean B Jeanglaude
(74) *Attorney, Agent, or Firm* — Brooks, Cameron & Huebsch

(57) ABSTRACT

Methods and devices are provided for data compression. Data compression can include receiving a plurality of data chunks, sampling at least some of the plurality of data chunks extracting a common portion from a number of the plurality of data chunks based on the sampling, and storing a remainder of the plurality of data chunks in memory.

15 Claims, 5 Drawing Sheets

HARDWARE COMPRESSION USING COMMON PORTIONS OF DATA

STATEMENT OF GOVERNMENT RIGHTS

This invention was made with Government support under Contract No. DE-SC0005026 awarded by the Department of Energy. The Government has certain rights in this invention.

BACKGROUND

Compression allows more economic encodings of data (e.g., fewer bits) than an original representation. Accordingly, compression may reduce both storage and communication requirements. Data can be compressed, for example, via the use of software and/or hardware. Software compression may afford a greater compression ratio than hardware compression, but may require significant computation resources and/or power use.

Existing hardware compression techniques may be overly conservative for large regular data arrays. For example, a number of hardware compression techniques target generic data types and frequent update(s) to data. When compressing generic data, existing hardware compression techniques may be limited to the use of either complex codes or simpler, less effective, codes. Moreover, frequent updates to data may cause a number of complications for existing hardware compression techniques associated with, for example, page mapping, fragmentation, and/or relocation.

DETAILED DESCRIPTION

Figure 1:
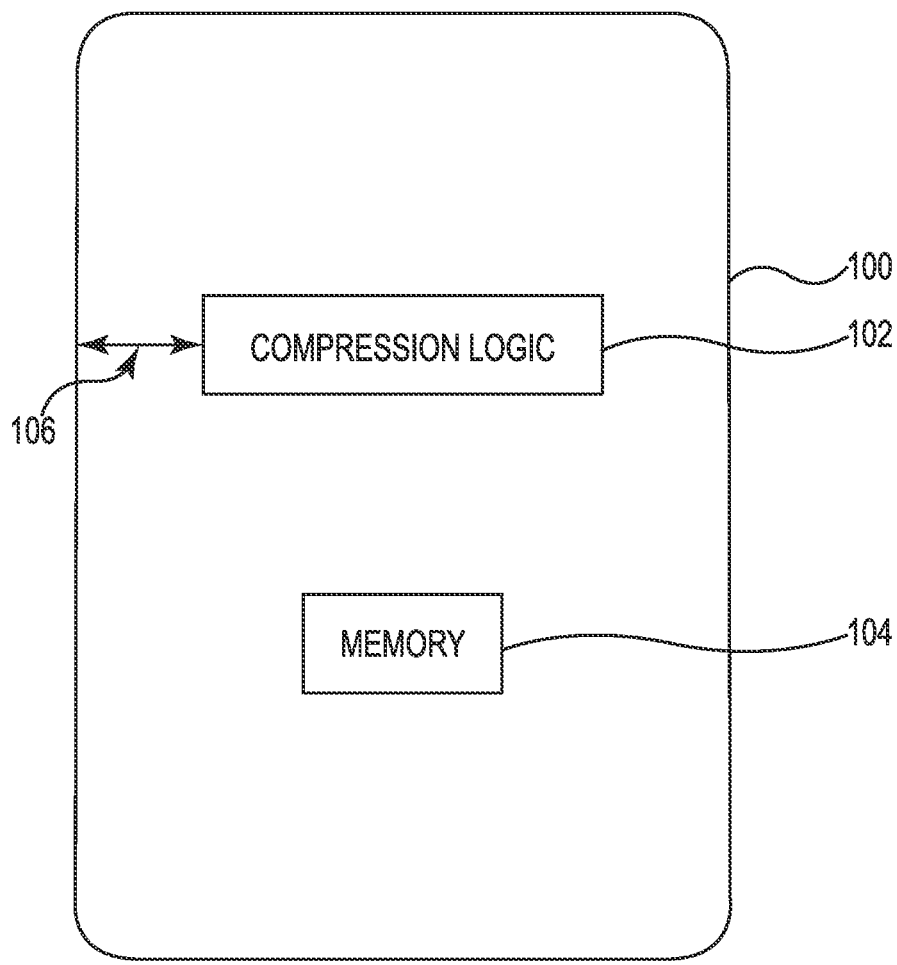
FIG. 1 illustrates a block diagram of an example of a device for data compression in accordance with one or more examples of the present disclosure.

Examples of the present disclosure include methods and/or devices. An example method for data compression can include receiving a plurality of data chunks, sampling at least some of the plurality of data chunks, extracting a common portion from a number of the plurality of data chunks based on the sampling, and storing a remainder of the plurality of data chunks in memory.

In the following detailed description of the present disclosure, reference is made to the accompanying drawings that form a part hereof, and in which is shown by way of illustration how examples of the disclosure can be practiced. These examples are described in sufficient detail to enable those of ordinary skill in the art to practice the examples of this disclosure, and it is to be understood that other examples can be utilized and that process, electrical, and/or structural changes can be made without departing from the scope of the present disclosure.

The figures herein follow a numbering convention in which the first digit or digits correspond to the drawing figure number and the remaining digits identify an element or component in the drawing. Similar elements or components between different figures can be identified by the use of similar digits. For example, 454-B can reference element "54" in FIG. 4B, and a similar element can be referenced as 454-C in FIG. 4C. Elements shown in the various figures herein can be added, exchanged, and/or eliminated so as to provide a number of additional examples of the present disclosure. In addition, the proportion and the relative scale of the elements provided in the figures are intended to illustrate the examples of the present disclosure, and should not be taken in a limiting sense.

In some approaches to compression, it has previously been data-structure oblivious, providing compression for a wide class of data (e.g., data type, record width, regularity, etc.) at the cost of complexity and speed. According to some examples of the present disclosure, hardware compression support can be provided for structured data (e.g., in columnar stores for modern databases). A number of examples of the present disclosure achieve simple, fast, and random-access friendly compression/decompression. In some examples, such advantages can be achieved at a lower compression ratio as compared to some previous approaches.

Simplicity and speed can be achieved using prefix compression (e.g., extracting a common portion, such as a prefix, across multiple data records and recording the remaining bits) with on-the-fly sampling (e.g., estimating the optimistic and conservative common portion as a data stream into memory from I/O or network), among other examples. Compared to some previous approaches to hardware compression, some examples of the present disclosure can exploit the value locality in columnar stores, for example, to provide better compression ratio and speed. Compared to some previous approaches to using executable instructions for compression (e.g., columnar compression), a number of examples of the present disclosure are faster and more energy efficient at a potential cost of a lowered compression ratio. Compression schemes associated with the present disclosure can be exposed to executable instructions for compression, so queries can use the compression metadata or compressed data to further improve performance.

FIG. 1 illustrates a block diagram of an example of a device 100 for data compression in accordance with one or more examples of the present disclosure. Hardware device 100 can be, for example, hardware logic (e.g., in the form of application specific integrated circuits (ASICs) such as in a network chip on a network device such as a router or switch) among others, however, examples of the present disclosure are not limited to a particular implementation of the device 100 unless otherwise indicated. As shown in FIG. 1, hardware device 100 includes compression logic 102, memory 104, and input-output path 106. Although FIG. 1 illustrates compression logic 102, examples in accordance with the present disclosure are not so limited. Rather, hardware device 100 can include other logic such as, for example, decompression logic, among others. As shown in FIG. 1, memory 104 can be coupled to hardware device 100.

Memory 104 can be volatile or nonvolatile memory. Memory 104 can also be removable (e.g., portable) memory, or non-removable (e.g., internal) memory. For example, memory 104 can be random access memory (RAM) (e.g., dynamic random access memory (DRAM), and/or phase change random access memory (PCRAM)), read-only memory (ROM) (e.g., electrically erasable programmable read-only memory (EEPROM), and/or compact-disk read-only memory (CD-ROM)), flash memory, a laser disk, a digital versatile disk (DVD), and/or other optical disk storage), and/or a magnetic medium such as magnetic cassettes, tapes, or disks, among other types of memory.

Further, although memory 104 is illustrated as being located in hardware device 100, examples of the present disclosure are not so limited. For example, memory 104 can also be located internal to another computing resource (e.g., enabling logic to be downloaded over the Internet or another wired or wireless connection).

Figure 2:
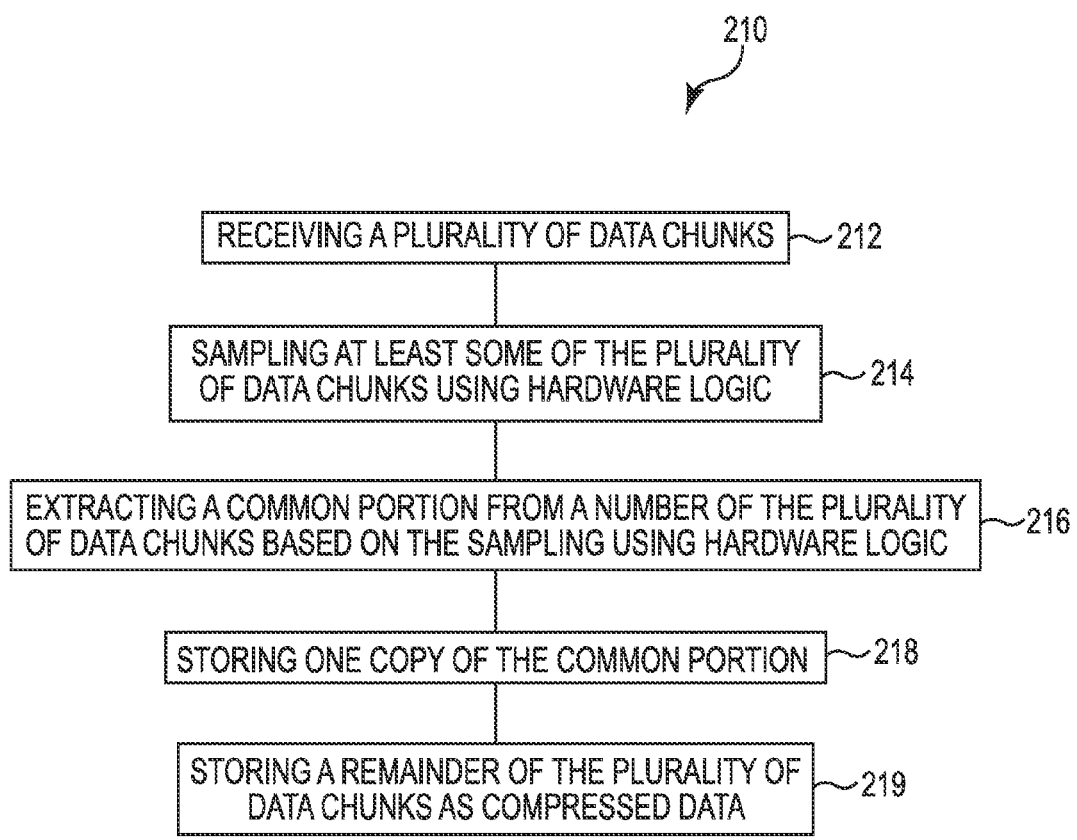
FIG. 2 is a flow chart illustrating an example of a method for data compression in accordance with one or more examples of the present disclosure.

FIG. 2 is a flow chart illustrating an example of a method 210 for data compression in accordance with one or more examples of the present disclosure. Method 210 can be performed, for example, by hardware device 100, previously discussed in connection with FIG. 1.

Figure 3:
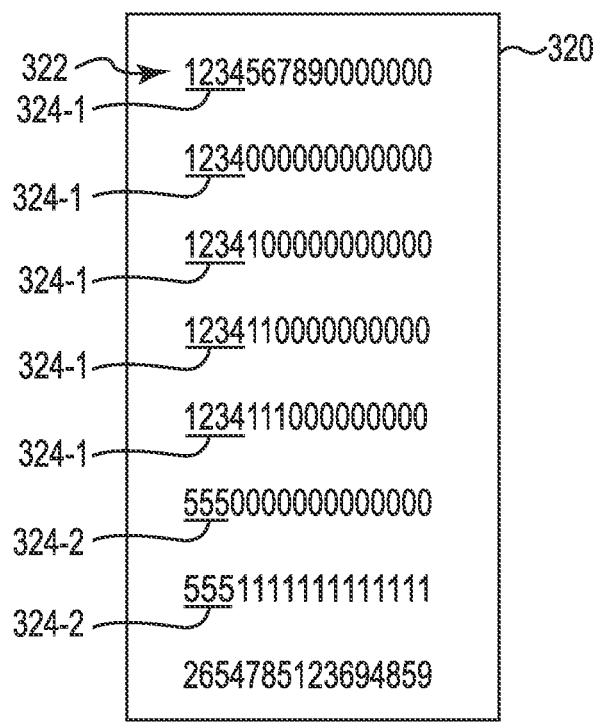
FIG. 3 illustrates a block diagram of an example of a data block in accordance with one or more examples of the present disclosure.

At block 212, method 210 includes receiving a plurality of data chunks. In various examples, data can be received in records arranged in packets (e.g., storage input/output packets, among others). In some examples, reference is made to particular arrangements and/or sizes of data received. For example, data can be received in "blocks" (e.g., 64-byte blocks) including a number of "chunks" (e.g., 8-byte chunks). Continuing in the example, a number of blocks can make up a "page" (e.g., a 4096-byte page). It is to be appreciated that these arrangements and/or sizes are illustrative examples, and examples of the present disclosure are not limited to a particular size and/or arrangement of data received. FIG. 3, discussed below, illustrates a non-limiting example of a data block as used herein.

Data can be received from an input-output path (e.g., input-output path 106 previously discussed in connection with FIG. 1) and/or through one or more network paths. Receiving data can include pre-sampling the data. Pre-sampling can include, for example, sorting, deduplicating, replicating and/or partitioning the data, among other pre-sampling functions. In some examples, receiving data can include storing the data (e.g., storing the data in persistent storage and/or main memory).

If data is stored in persistent storage (e.g., via a memory buffer), a hardware compression logic (e.g., compression logic 102 previously discussed in connection with FIG. 1) can be placed on the input-output path. If data is stored in main memory, a special instruction or memory mapped input-output write can be executed to trigger data compression (e.g., the compressor can be placed on the memory access path).

At block 214, method 210 includes sampling at least some of the plurality of data chunks using hardware logic. As data is received, the compressor can buffer the data to be stored in blocks. In some examples, the compressor can sample the first few blocks received to extract one or more common portions (e.g., prefixes, as discussed below) for all of the chunks within the received blocks. Sampling can be carried out on-the-fly such that the sampling does not add latency to the data store operations. For example, sampling can be performed only on received and/or buffered blocks while waiting for the remaining blocks to be received.

Sampling can include sampling a portion of the blocks in a page or all of the blocks in a page. Such a determination can be made depending on one or more requirements associated with compression latency. For example, sampling a portion (e.g., a subset) of the blocks in a page can allow compression time and/or buffering time to be overlapped, but may be incomplete with respect to the collection of relevant information associated with one or more common portions, as discussed below.

Hardware logic (e.g., a compressor) can be configured to buffer data to be stored in blocks, and sample the first few blocks to identify common portions to be used for chunks (e.g., all of the chunks) within the blocks. Such sampling does not add latency to a data store operation because the sampling is carried out on-the-fly and on the buffered blocks while waiting for the remaining blocks in the page to arrive. For example, hardware logic can be configured to set initial values for a common portion template (e.g., PRE) to be the first data chunk (e.g., 8-byte chunk) of a block (e.g., a 64-byte block) received, and can set initial values for another template (e.g., a delta (DEL) template) to a reset value (e.g., all 0s). For the remaining chunks of the first block received, a logic operation can be performed (e.g., performed bitwise). For example, a logic operation, DEL=DEL or (PRE xor CHUNK) can be performed on a received second chunk. The logic operation can yield DEL=all 0s if PRE=CHUNK. For example, if the second data chunk received is the same as the first data chunk received, the delta template can remain all 0s. Alternatively, if the second data chunk is not the same as the first data chunk, the logic operation can return other values.

After sampling (e.g., sampling all chunks in the block), a value for the common portion template (PRE) and a number of significance bits (NPRE) in DEL can be determined. For example, PRE can be determined by the hardware logic operation: PRE=PRE and (not DEL). In some examples, the number of significance bits in DEL can be defined as the number of most significant and consecutive 0s in DEL. For example, NPRE can be 8 (e.g., the underlined portion) when DEL is:
<u>00000000</u>1111000011110000111100001111000011110000 1111000011110000.

As more blocks are sampled, the PRE and/or NPRE for each block can be populated into a histogram. From the common portions, a most common portion can be determined over the number of blocks. In some examples, the most common portion can be referred to as pPRE, and a corresponding number of significance bits in DEL for the most popular common portion pPRE can be referred to as pNPRE. The most common portion pPRE need not occur in every block, rather it can refer to the common portion that occurs most frequently across the blocks.

A common portion that occurs at least once in each block can be referred to as a page-common portion (cPRE). In some examples, the page-common portion (cPRE) can be determined with respect to a plurality of data blocks (e.g., all of the data blocks), for example, by the following logic operations:

```
tempDEL = 0;
for (i=1; i<n; i++) // n = the number of blocks considered
{
    d = PRE[0] xor PRE[i];
    code[i] = (bool) d * 1; // whether PRE[i] differs from PRE[0]
    tempDEL = tempDEL xor d;
}
DEL = DEL or tempDEL
cPRE = PRE[0] and (not DEL) // page-common PRE for multiple blocks
cNPRE= number of significance bits in DEL
```

Accordingly, a corresponding number of significant bits in DEL can be referred to as cNPRE for the page-common portion. The page-common portion (cPRE) can be common to all data blocks received. Although two common portions are discussed, examples in accordance with the present disclosure do not limit the determination of common portion(s) to a particular number and/or scope of common portions.

At block 216, method 210 includes extracting a common portion from a number of the plurality of data chunks based on the sampling using hardware logic. For example, a common portion such as PRE, pPRE, and/or cPRE can be extracted from chunks of data that include such a common portion. In some examples, extracting a common portion of the data chunks can include storing one copy of the common portion(s) for a plurality of chunks of data, such as a page of data. When a common portion is extracted from a chunk of data, the result is to shorten the length of the chunk so that only a remainder of data of the chunk remains. For example, if a chunk of data includes 8 bytes: 1110011101111000110010111100001010100010100110 0100110111001010 and the common portion (the underlined portion) is 8 bits, the 8 bits can be extracted and the remainder is now 7 bytes: 011110001100101111000010101000101001110010011011 1001010. Thus, the 8 byte chunk has been compressed to 7 bytes for storage. Examples are not limited to a particularly sized chunk, block, page, or common portion.

A determination can be made as to how many common portions to use for extraction from a plurality of data chunks. For example, a determination can be made as to whether to use one or two common portions to compress the plurality of data chunks (e.g., pPRE and/or cPRE, among others). Examples are not limited to the use of a particular number of common portions.

In some examples, determining a number of common portions to use for compressing the data chunks can include a comparison of compression ratios achieved in association with storing the respective remainders of each of the plurality of data chunks. For example, a compression ratio achieved in association with using one common portion can be compared to a compression ratio achieved using two common portions. In a number of examples, if pNPRE is smaller than cNPRE, and associating two common portions with the remainder(s) of the data chunks will yield a greater compression ratio, then pPRE can be used as a first (e.g., optimistic) common portion, and cPRE can be used as a second (e.g., overflow) common portion. A second common portion can be used, for example, in an event where a data chunk cannot be encoded using pPRE (e.g., a data chunk does not include pPRE). Alternatively, a single common portion (e.g., cPRE) can be used as the common portion to encode the plurality of data chunks (e.g., the entire data page), for example, when using a single common portion provides a greater compression ratio than using two common portions. Examples are not limited to using a particular number of common portions that provide a greatest compression ratio.

At block 218, method 210 includes storing one copy of the common portion. At block 219, method 210 includes storing a remainder of the plurality of data chunks as compressed data. As previously discussed, storing a respective remainder of each of the plurality of data chunks in memory can include storing the plurality of data chunks in association with 1 and/or 2 common portions. Such examples can provide an advantage of an increased compression ratio by storing only one copy of the common portion rather than storing the common portion with each chunk than includes the common portion. In some examples, if every chunk in a page is the same, the page can be stored via the use of a flag and the value of the first chunk of the page received (e.g., flag 442-A and first chunk received 444, discussed below in connection with FIG. 4).

FIG. 3 illustrates a block diagram of an example of a data block 320 in accordance with one or more examples of the present disclosure. As shown in FIG. 3, data block 320 includes a number of data chunks (e.g., data chunk 322). Although 8 data chunks are shown in block 320, examples of the present disclosure are not limited to a particular number of data chunks. Further, although the data chunks of data block 320 are shown with 16 digits, data chunks in accordance with one or more examples of the present disclosure are not limited to a particular number of digits. Although not shown in FIG. 3, a number of data blocks (e.g., 64 blocks) can form a data page in some examples.

As illustrated in FIG. 3, some of the data chunks include a first common portion 324-1 (e.g., the underlined portion "1234"), while some of the data chunks include a second common portion 324-2 (e.g., the underlined portion "555"). In the example illustrated in FIG. 3, the first common portion 324-1 is longer (e.g., includes more digits) than the second common portion 324-2. The last data chunk illustrated in FIG. 3 does not include a portion common to any of the other data chunks in the data block 320.

According to some examples of the present disclosure, the data in data block 320 can be compressed using the first common portion 324-1. In such instances, the first common portion 324-1 can be extracted from those data chunks including the first common portion 324-1 and those data chunks can be stored without the first common portion 324-1. One copy of the first common portion 324-1 can be stored and used with each of those data chunks that previously included the first common portion 324-1.

According to some examples of the present disclosure, the data in data block 320 can be compressed using the second common portion 324-2. In such instances, the second common portion 324-2 can be extracted from those data chunks including the second common portion 324-2 and those data chunks can be stored without the second common portion 324-2. One copy of the second common portion 324-2 can be stored and used with each of those data chunks that previously included the second common portion 324-2.

According to some examples of the present disclosure, the data in data block 320 can be compressed using both the first common portion 324-1 and the second common portion 324-2. In such instances, the first common portion 324-1 and the second common portion 324-2 can be extracted from those respective data chunks including the first common portion 324-1 or the second common portion 324-2 and those data chunks can be stored without the first common portion 324-1 or the second common portion 324-2. One copy of each of the first common portion 324-1 and the second common portion 324-2 can be stored and used with each of those respective data chunks that previously included the first common portion 324-1 or the second common portion 324-2.

Figure 4A:
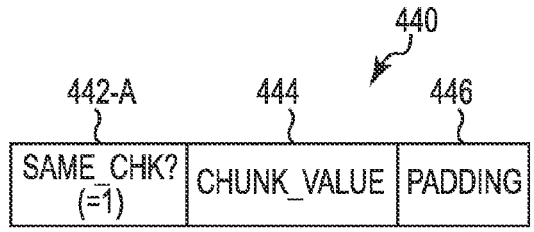
FIG. 4A illustrates an example data structure diagram in accordance with one or more examples of the present disclosure.
Figure 4B:
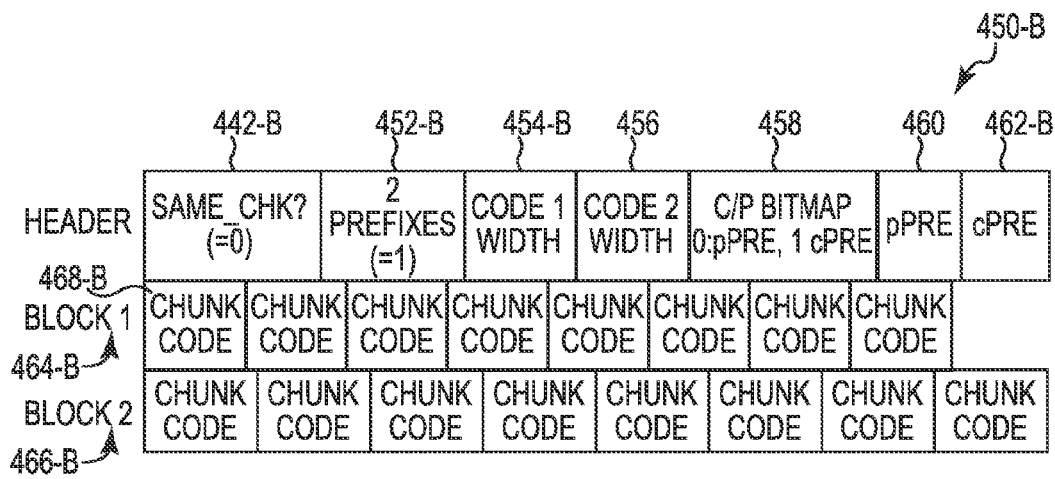
FIG. 4B illustrates another example data structure diagram in accordance with one or more examples of the present disclosure.
Figure 4C:
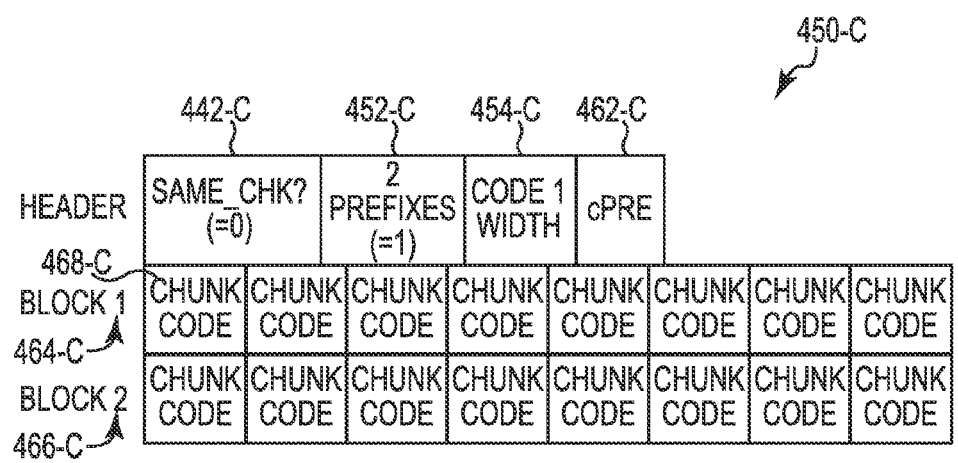
FIG. 4C illustrates another example data structure diagram in accordance with one or more examples of the present disclosure.

FIGS. 4A, 4B, and 4C illustrate data structure diagrams in accordance with one or more examples of the present disclosure. Data structure diagrams can represent data compressed and/or stored in memory. In some examples, data structure diagrams can include one or more headers. In some examples data structure diagrams can include a number of data chunks (e.g., entire data chunks and/or portions of data chunks remaining following an extraction of a common portion from the data chunks).

FIG. 4A illustrates an example data structure diagram 440 in accordance with one or more examples of the present disclosure. As shown in FIG. 4A, data structure diagram 440 includes a flag 442-A, a first chunk received 444, and padding 446. In some embodiments, flag 442-A can provide an indication that all data chunks in a page stored in memory are the same. For example, flag 442-A can include code as shown in FIG. 4A: same_chk? (=1). As previously discussed, hardware logic can set a common portion to be the first data chunk of a data block received (e.g., first chunk received 444). Examples in which a data page contains a repetition of the same data chunk can include storing one copy of the data chunk (e.g., first chunk received 444) in association with flag 442-A along with an indication (e.g., flag 442-A) that every data chunk in the page is the same as the first chunk received 444.

FIG. 4B illustrates another example data structure diagram 450-B in accordance with one or more examples of the present disclosure. For example, FIG. 4B can illustrate a page of data stored in memory in association with two common portions. As shown in FIG. 4B, data structure diagram 450-B includes a header having a flag 442-B (e.g., providing an indication that all data chunks in a page stored in memory are not the same "same_chk?=0"), an indicator 452-B of a number of common portions extracted from a plurality of data chunks (e.g., 2 prefixes=1), a value of a first common portion extracted (e.g., a most common portion within a block of data chunks, "pPRE") 460, a value of a second common portion extracted (e.g., a page-common portion across a number of blocks, "cPRE") 462-B and the lengths (e.g., number of bits) of the first and second remainders, 454-B (e.g., "Code1 width") and 456 (e.g., "Code2 width"), respectively. Data structure diagram 450-B includes a data block 464-B (e.g., "Block 1") and a data block 466-B (e.g., "Block 2"). Data blocks 464-B and 466-B can, for example, be blocks of data chunks (e.g., data chunk 468-B) stored in memory in association with common portions 460 and/or 462-B. For example, data block 464-B can be stored in memory associated with most common portion 460 and data block 466-B can be stored in memory associated with page-common portion 462-B.

FIG. 4C illustrates another example data structure diagram 450-C in accordance with one or more examples of the present disclosure. For example, FIG. 4C can illustrate a page of data stored in memory in association with a single common portion (e.g., "cPRE" 462-C). As shown in FIG. 4C, data structure diagram 450-C includes a header having a flag 442-C (e.g., providing an indication that all data chunks in a page stored in memory are not the same "same_chk?=0"), an indicator 452-C of a number of common portions extracted from a plurality of data chunks (e.g., 2 prefixes=0, where a default when two prefixes are not stored is that one prefix is stored), a length of a remainder 454-C of a data chunk (e.g., "Code1 width"), and a value 462-C of the page-common portion extracted (e.g., "CPRE"). Data structure diagram 450-C includes a data block 464-C (e.g., "Block 1") and a data block 466-C (e.g., "Block 2"). Data blocks 464-C and 466-C can, for example, be blocks of data chunks (e.g., data chunk 468-C) stored in memory in association with page-common portion 462-C.

Figure 5:
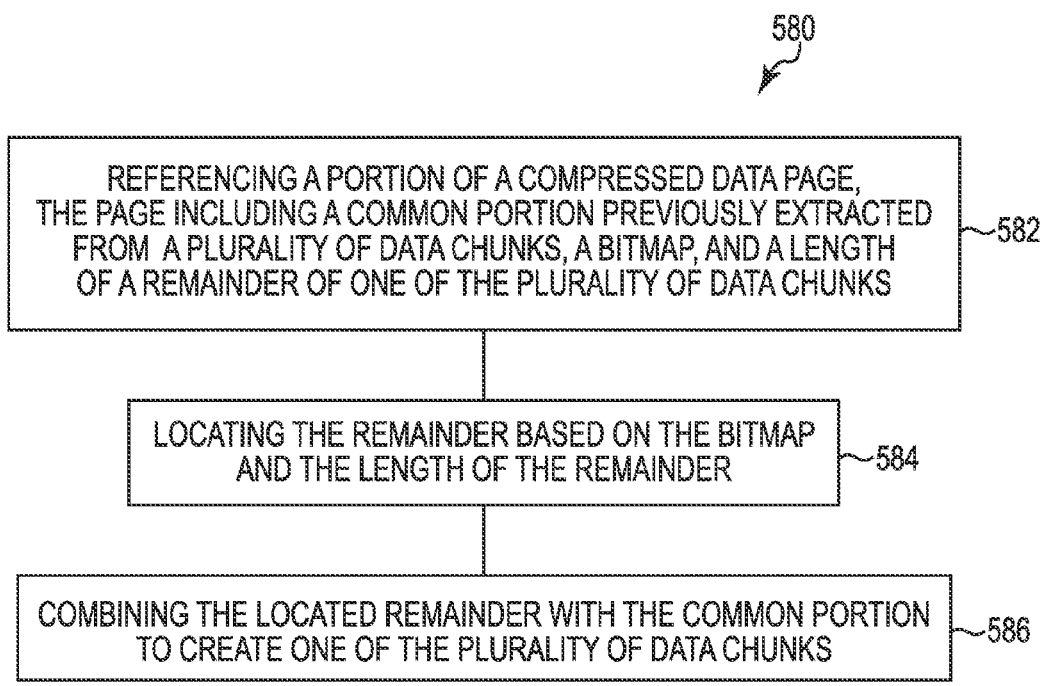
FIG. 5 is a flow chart illustrating an example of a method for accessing a compressed data chunk in accordance with one or more examples of the present disclosure.

FIG. 5 is a flow chart illustrating an example of a method 580 for accessing a compressed data chunk in accordance with one or more examples of the present disclosure. Method 580 can be performed, for example, by hardware device 100 previously discussed in connection with FIG. 1.

At block 582, method 580 includes referencing a portion of a compressed data page, the page including a common portion previously extracted from a plurality of data chunks, a bitmap, and a length of a remainder of one of the plurality of data chunks. In some examples, a common portion previously extracted from a plurality of data chunks can include common portion(s) of data chunk(s) previously discussed in connection with FIG. 3. In some examples, the common portions can be referenced in a header of a data structure diagram such as the examples illustrated in FIGS. 4A-4C (e.g., common portion 460 in data structure diagram 450-B). In some examples, a data structure diagram can include a bitmap (e.g., bitmap 458 in data structure diagram 450-B). A length of a remainder of a data chunk can, for example, be referenced in a header of a data structure diagram (e.g., length of first remainder 454-B in data structure diagram 450-B).

At block 584, method 580 includes locating the remainder based on the bitmap and the length of the remainder. For example, the bitmap can indicate a starting location of the remainder and the length of the remainder can indicate how many bits are included with the remainder. The combination of the bitmap and the length of the remainder can allow hardware to accurately capture the entire remainder.

At block 586, method 580 includes combining the located remainder with the common portion to create one of the plurality of data chunks. Once the remainder has been located, it can be combined with the common portion to recreate the entire (e.g., original) data chunk. Such location and combination may be referred to herein as decompression.

The above specification, examples and data provide a description of the method and applications, and use of the system and method of the present disclosure. Since many examples can be made without departing from the spirit and scope of the system and method of the present disclosure, this specification merely sets forth some of the many possible example configurations and implementations.

Although specific examples have been illustrated and described herein, those of ordinary skill in the art will appreciate that an arrangement calculated to achieve the same results can be substituted for the specific examples shown. This disclosure is intended to cover adaptations or variations of one or more examples of the present disclosure. It is to be understood that the above description has been made in an illustrative fashion, and not a restrictive one. Combination of the above examples, and other examples not specifically described herein will be apparent to those of skill in the art upon reviewing the above description. The scope of the one or more examples of the present disclosure includes other applications in which the above structures and methods are used. Therefore, the scope of one or more examples of the present disclosure should be determined with reference to the appended claims, along with the full range of equivalents to which such claims are entitled.

What is claimed:

1. A method for data compression, comprising:
   receiving a plurality of data chunks;
   sampling at least some of the plurality of data chunks using hardware logic;
   extracting a common portion from a number of the plurality of data chunks based on the sampling using hardware logic;
   storing one copy of the common portion; and
   storing a remainder for each of the plurality of data chunks as compressed data, wherein the remainder does not comprise the common portion.

2. The method of claim 1, wherein the method further includes buffering the received plurality of data chunks prior to sampling, and wherein sampling is performed on the fly such that latency is not added to storing the remainder of the plurality of data chunks by the sampling or extracting.

3. The method of claim 1, wherein the method further includes:
   determining the common portion based on the sampling; and
   determining a length of the common portion based on the sampling.

4. The method of claim 1, wherein the method further includes:

receiving a respective plurality of data chunks from each of a plurality of blocks;
sampling at least some of the plurality of data chunks from each of the plurality of blocks; and
determining a most common portion of a number of the sampled at least some of the plurality of data chunks.

5. The method of claim 1, wherein the method further includes associating the one copy with a number of respective remainders of the plurality of data chunks stored as compressed data.

6. The method of claim 1, wherein the method further includes:
determining a number of additional common portions; and
determining a most common portion based on the common portion and the number of additional common portions.

7. The method of claim 1, wherein the method further includes determining a common portion across a plurality of blocks.

8. The method of claim 1, wherein the method further includes:
determining a number of additional common portions; and
determining a longest common portion based on the common portion and the number of additional common portions.

9. The method of claim 1, wherein the method further includes:
determining a number of common portions;
determining a most common portion based on the number of common portions;
determining a longest common portion based on the number of common portions;
determining a compression ratio for the plurality of data chunks associated with extracting each of the most common portion and the longest common portion; and
extracting one of the most common portion and the longest common portion resulting in a greater compression ratio.

10. A method of accessing a compressed data chunk, comprising:
referencing a portion of a compressed data page, the page including:
a common portion previously extracted from a plurality of data chunks;
a bitmap; and
a length of a remainder of one of the plurality of data chunks, wherein the remainder does not comprise the common portion;
locating the remainder based on the bitmap and the length of the remainder; and
combining the located remainder with the common portion to create one of the plurality of data chunks.

11. The method of claim 10, wherein the method further includes combining the common portion with all the data chunks in the page in response to the common portion being common to all the data chunks in the page.

12. The method of claim 10, wherein the method further includes determining a starting bit position of a particular chunk in the page.

13. A device, comprising:
a data compression logic to:
receive, from an input-output path, a data page including a plurality of data chunks, wherein the page is received one data chunk at a time;
extract a first common portion from a first number of the plurality of data chunks while the page is being received;
send a respective remainder of each of the first number of the plurality of data chunks to memory storage in association with the first common portion;
extract a second common portion from a second number of the plurality of data chunks while the page is being received; and
send a respective remainder of each of the second number of the plurality of data chunks to memory storage in association with the second common portion, wherein the remainder does not comprise the second common portion.

14. The device of claim 13, further comprising data compression logic to send an entirety of the page to memory storage in association with the second common portion if storing the entirety of the page in association with the second common portion uses less memory than storing the entirety of the page in association with the first and second common portions.

15. The device of claim 13, further comprising data compression logic to send an entirety of the page in association with a first chunk received by the device and a flag if all of the data chunks of the plurality of data chunks are identical.

* * * * *